(12) United States Patent
Yamada et al.

(10) Patent No.: US 6,943,048 B2
(45) Date of Patent: Sep. 13, 2005

(54) METHOD FOR MANUFACTURING OPTOELECTRONIC MATERIAL

(75) Inventors: Yuka Yamada, Kawasaki (JP);
Takehito Yoshida, Kawasaki (JP);
Nobuyasu Suzuki, Kawasaki (JP);
Toshiharu Makino, Kawasaki (JP);
Toshihiro Arai, Tokyo (JP); Kazuhiko Kimoto, Ishinomaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 62 days.

(21) Appl. No.: 10/407,250

(22) Filed: Apr. 7, 2003

(65) Prior Publication Data

US 2003/0203598 A1 Oct. 30, 2003

Related U.S. Application Data

(62) Division of application No. 09/784,301, filed on Feb. 16, 2001, now abandoned.

(30) Foreign Application Priority Data

Mar. 9, 2000 (JP) .......................................... 2000-64783

(51) Int. Cl.⁷ .............................................. H01L 21/00
(52) U.S. Cl. .............................. 438/22; 438/29; 438/48
(58) Field of Search ............................. 438/22, 27, 30, 438/38, 48

(56) References Cited

U.S. PATENT DOCUMENTS

| | | | | |
|---|---|---|---|---|
| 4,125,592 A | * | 11/1978 | Ezis et al. | 264/647 |
| 5,285,078 A | | 2/1994 | Mimura et al. | |
| 5,332,697 A | * | 7/1994 | Smith et al. | 438/479 |
| 5,894,189 A | | 4/1999 | Ogasawara et al. | |
| 5,990,605 A | | 11/1999 | Yoshikawa et al. | |
| 6,359,276 B1 | | 3/2002 | Tu | |

FOREIGN PATENT DOCUMENTS

| | | |
|---|---|---|
| JP | 04-356977 | 12/1992 |
| JP | 05-206514 | 8/1993 |
| JP | 6-283755 | 10/1994 |

* cited by examiner

Primary Examiner—Dung A. Le
(74) Attorney, Agent, or Firm—Browdy and Neimark, P.L.L.C.

(57) ABSTRACT

An optoelectronic material, device applications, and methods for manufacturing the optoelectronic material are provided to make it possible to obtain stable characteristics without deterioration of luminescence over time in the atmosphere. The optoelectronic material is composed of a porous silicon the surface of which is nitrided to form a silicon nitride layer thereon. This allows a stable electroluminescence to be obtained, without oxidation of the surface of the porous silicon.

12 Claims, 6 Drawing Sheets

METHOD FOR MANUFACTURING OPTOELECTRONIC MATERIAL

This is a divisional application of Ser. No. 09/784,301 filed Feb. 16, 2001, now abandoned.

BACKGROUND OF THE INVENTION

1. Field of the Invention

The present invention relates to an optoelectronic material and device application, and a method for manufacturing an optoelectronic material, and more specifically, to an optoelectronic material formed from luminescent silicon (Si)—a substance with an inexhaustible supply and that causes no environmental pollution—as its core, and further characterized by excellent compatibility with Si-LSI technology, self-luminescence, and stability, and a manufacturing method therefore.

2. Description of the Prior Art

As Si is an indirect transition semiconductor, and its bandgap is near the infrared region, at 1.1 eV, it has not been thought possible to use it as a light emitting device in the visible region. In 1990, however, visible light emission at room temperature was confirmed with porous Si (e.g. L. T. Canham, Applied Physics Letters; Vol. 57, No. 10, 1046 (1990)). Since that time, research on visible light emission at room temperature with Si as the base material has become quite popular. As the vast majority of these reports have concerned porous Si, this luminescent porous Si will be described as an example of the prior art.

Basically, luminescent porous Si is formed by anodizing the surface of a single-crystal Si substrate with a solution comprising hydrofluoride mainly. Up to the present, photoluminescence (PL) has been confirmed at a number of wavelengths in the visible light region, from 800 nm (red) to 425 nm (blue). There have also been recent attempts to generate electroluminescence (EL) through current injection excitation. These technologies have been disclosed, for example as described in Japanese Patent Laid-Open Publication No. Hei. 4-356977 and Japanese Patent Laid-Open Publication No. Hei. 5-206514.

Some of the hypotheses proposed to explain the luminescence mechanism of Si, which is an indirect transition semiconductor, are: that among the porous shapes are nanometer (nm) order three-dimensional microstructure regions, which cause a loosening of the wave frequency selection rules, causing a radiative electron-hole recombination process; and that a Si polycyclic oxide (siloxane) is formed on the surface of the porous Si, and on the interface between this siloxane and Si is a new energy level that contributes to the radiative recombination process. But at any rate, it appears certain that with regard to optical excitation effects, a quantum confinement effect changes the energy band structure (broadening the gap width).

With conventional technology, however, the creation of a Si microstructure like porous Si increases the proportion of atoms exposed on the surface, making the luminescent characteristics dependent on the surface state. Si easily oxidizes, and oxidation of the surface changes the band structure, changing the luminescent wavelengths and degrading the luminescent intensity. This problem is particularly striking with porous Si, because of the instability of the hydrogen termination on the surface.

SUMMARY OF THE INVENTION

In order to solve the above-mentioned problems of the prior art, the optoelectronic material of the present invention uses a construction in that the surface of porous Si or Si ultrafine particles is subjected to nitriding. This keeps the surface of the ultrafine particles from being oxidized in the presence of air, enabling a stable luminescence to be obtained.

The present invention comprises a porous silicon as a first optoelectronic material, the surface of the porous silicon being nitrided. This allows a stable luminescence to be obtained, without oxidation of the surface of the porous silicon.

The present invention also comprises silicon ultrafine particles with particle sizes of 1–50 nm as a second optoelectronic material, the surfaces of the silicon ultrafine particles or the entirety thereof being nitrided. This allows a stable electroluminescence to be obtained, without the surfaces of the silicon ultrafine particles being oxidized.

The present invention is also an optoelectronic device having an optoelectronic material layer containing the above-mentioned first or second optoelectronic material, and a pair of electrodes being equipped on the top and bottom of the optoelectronic material layer. This construction provides an electroluminescence effect by injecting a small amount of carriers by means of the pair of the electrodes in the porous silicon or silicon ultrafine particles in the optoelectronic material layer and forming electron-hole pairs, creating said radiative electron-hole recombination process.

The present invention is also an optoelectronic conversion device having an optoelectronic material layer including the above-mentioned first or second optoelectronic material, and a pair of electrodes being equipped on the top and bottom of the optoelectronic material layer. This provides a photodetector function by detecting changes in internal resistance or photoelectromotive force, by generating carriers by means of light irradiation on the optoelectronic material layer.

The present invention is also a method for manufacturing an optoelectronic material comprising the step of forming a porous silicon by anodizing a single-crystal silicon, and the step of annealing the porous silicon with an ambient gas containing at least nitrogen to nitride the surface of the porous silicon. This allows stable luminescence to be obtained, without the surface of the porous silicon being oxidized.

The present invention is also a method for manufacturing an optoelectronic material comprising the step of annealing silicon ultrafine particles with particle size of 1–50 nm with an ambient gas containing at least nitrogen, at a temperature of at least 900 degrees Celsius to nitride surfaces of the silicon ultrafine particles or the entirety thereof. This allows stable luminescence to be obtained, without the surface of the silicon ultrafine particles being oxidized.

The present invention is also a method for manufacturing an optoelectronic material comprising a target material placement step of placing a target material inside a reaction chamber; a substrate placement step of placing a deposition substrate inside the reaction chamber; and an ablation step of irradiating the target material placed by means of the target material placement step with laser beam to generate desorption and ejection of the target material; wherein the material in the ambient gas that has been desorped and ejected during the ablation step on the target is condensed and grown, and the ultrafine particles obtained therefrom are deposited on said deposition substrate to obtain the optoelectronic material composed of said ultrafine particles. In this method, an ambient gas containing nitrogen at a constant pressure is introduced into the reaction chamber during said ablation step to nitride the surfaces or entirety of said ultrafine particles. This construction allows the use of a high-purity target obtained by fusion refining a single element, as well as the manufacture of an optoelectronic material with excellent stability in a single step.

Additionally, the present invention is a method for manufacturing an optoelectronic material comprising a target placement step of placing a target material inside a reaction chamber; a substrate placement step of placing a deposition substrate inside the reaction chamber; and an ablation step of irradiating the target material placed by the target material placement step with laser beam to generate desorption and ejection of said target material; wherein the material in the ambient gas that has been desorped and ejected during said ablation step on the target is condensed and grown, and the ultrafine particles obtained therefrom are deposited on said deposition substrate to obtain the optoelectronic material composed of the ultrafine particles. In this method, the ultrafine particles to be obtained comprise at least two different elements; and a target material with the same or nearly the same composition as said ultrafine particles is used. In the ablation step, an inert gas is introduced into the reaction chamber at a set pressure. This construction makes it possible to manufacture an optoelectronic material with excellent stability in a single step, without using any reactive gas.

Here, the ultrafine particles to be obtained are nitrided silicon ultrafine particles, and $Si_xN_y$ may be used as the target.

In the above method, it is furthermore preferable to have the step of changing the pressure at which low-pressure gas is introduced. This construction makes it possible to control the average diameter of said ultrafine particles.

Thus, by employing a construction in which porous Si or Si ultrafine particles are nitrided, the present invention makes it possible to obtain stable luminescence, without oxidizing the surface of the luminescent Si. Furthermore, because $Si_3N_4$ has a larger bandgap than that of Si, it is possible to effectively appear quantum confinement effects of carriers in the Si core.

Using the type of optoelectronic material mentioned above, sandwiching the optoelectronic material with a pair of electrodes, at least one of which is indirect contact therewith, and constructing therefrom a light emitting device or an optoelectronic conversion device, makes it possible to obtain an optimal electrical contact between the electrode and optoelectronic material layer, making it possible to provide an effective electroluminescence phenomenon, or an effective photodetector function.

The optoelectronic material or optoelectronic material device application of the present invention uses a material with an inexhaustible supply and which does not cause environmental pollution, and that has excellent Si-LSI compatibility, stability, high environmental resistance, freedom from assembly and the like, and is suitable for a variety of multimedia-compatible devices.

Consequently, an object of the present invention is to solve the above-mentioned conventional problems, by providing a method for manufacturing an optoelectronic material that makes it possible to obtain stable characteristics, without time decay of luminescence in the atmosphere and the like.

The following embodiments will thus be described, making reference to the accompanying drawings, in order to further clarify the objects and advantages of the present invention.

DESCRIPTION OF THE PREFERRED EMBODIMENTS

First Embodiment

Below is a detailed description of the optoelectronic material, and a manufacturing method therefor, of the present invention as a first embodiment thereof, using FIGS. 1 through 4(b).

In the present embodiment, porous Si is used as luminescent Si. Here is described the optoelectronic material formed by nitriding its surface, and a manufacturing method thereof.

Figure 1:
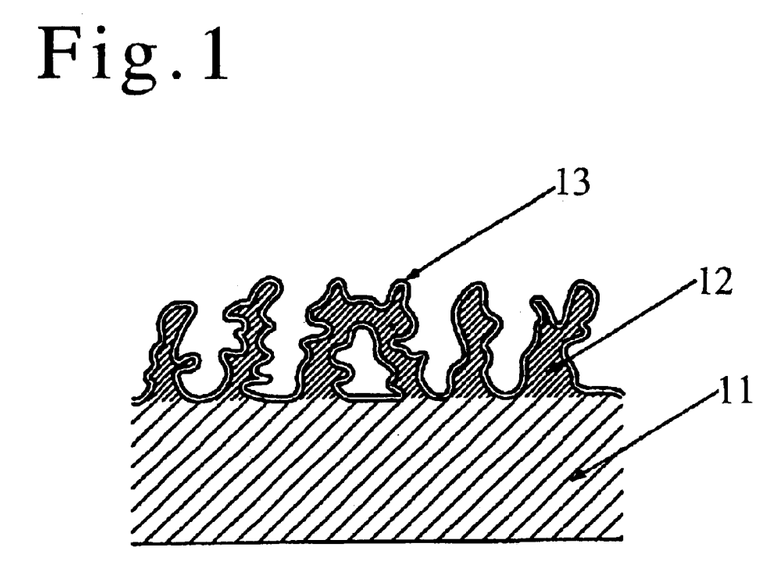
FIG. 1 is a cross-sectional view showing a construction of the optoelectronic material of a first embodiment of the present invention.

FIG. 1 shows a cross-sectional view showing a construction of the optoelectronic material of the present embodiment. In FIG. 1, reference numeral 11 denotes a Si single-crystal substrate; 12 a porous Si; and 13 a Si nitride layer.

The manufacturing method is described using this figure. First, by anodizing p-type low-resistance (0.06–0.12 Ω·cm) Si single-crystal substrate 11 with crystal plane orientation (100), porous Si 12 is formed on its surface. As a concrete procedure, after ultrasonic washing of Si single-crystal substrate 11 for five minutes each with acetone, methanol, and ultra-pure distilled water, the surface oxide film is removed using a hydrofluoric acid (HF) solution diluted to 10% capacity, in order to obtain ohmic contact between the substrate and indium (In) electrodes. Then, after washing with ultra-pure distilled water for three minutes, In backside electrodes were formed on four corners of the reverse-surface. After forming the electrodes, the substrate was placed in a Teflon cell, and a coiled platinum wire was placed on the front surface of the substrate, forming the opposite electrode. During anodization, hydrogen gas is generated from the Si single-crystal substrate surface, which is the anode. For this reason, a local electrical field is easily formed between the Si and solution as the Si becomes porous, causing an uneven porous Si layer. Thus, ethanol ($C_2H_5OH$), which acts as a surfactant, was mixed with the HF solution, in order to efficiently remove the hydrogen generated by the reaction to create porosity. When the volume ratio of HF (50% by weight) to $C_2H_5OH$ reached 2:3, a porous material layer with a high photoluminescence (PL) efficiency and maximum-porosity was obtained. After this HF solution was stirred, it was placed in the Teflon cell, the injection of current through the solution was begun using a constant current power supply. The electric current density was about 35 mA/cm$^2$, and the current was applied for 10 minutes. During this process, the components were irradiated using a 50 W halogen lamp. After the process was completed, the components were left in this state for 10 minutes, and then etching was carried out. Next, the substrate was removed from the Teflon cell, and washed with flowing ultra-pure distilled water for three minutes. Subsequently, the In electrodes were removed from the rear surface of the substrate using hydrochloric acid aqueous solution diluted to 20%. Finally, the substrate was washed with ultra-pure flowing distilled water for 3 minutes, obtaining porous Si 12.

Next, the porous Si 12 is annealed, hydrogen terminated at the Si dangling-bond is removed and the surface nitrided, forming Si nitride layer 13. A rapid thermal annealing apparatus was used so that there was little change in the size of the microcrystals. Specifically, the Si single-crystal substrate 11 with formed porous Si 12 was placed inside the apparatus, and after evacuating the interior of the apparatus to a high vacuum by bringing it to $5\times10^{-3}$ Pa using a turbo molecular pump, high-purity (6N) nitrogen ($N_2$) gas was introduced at 1.01/min, then annealing was carried out for one minute at 1,100 degrees Celsius.

The optoelectronic material obtained by the above-mentioned method was measured using infrared absorption, XPS, PL, and Raman scattering, to evaluate changes in structure and optical properties before and after annealing.

The results of the infrared absorption analysis of the porous Si before and after annealing indicated that before annealing, in peaks caused by Si—O bonds were observed, as well as peaks caused by Si—O—H, Si—H, and Si—$H_2$ bonds. In contrast, after annealing the peaks to which hydrogen contributed disappeared, and only Si—O bond peaks were observed. These results indicate that annealing eliminated dangling-bond terminal hydrogen present on the surface of the Si microcrystals. Furthermore, XPS analysis detected N in the porous Si after annealing, seeming to indicate that the surface had been nitrided.

Figure 2:
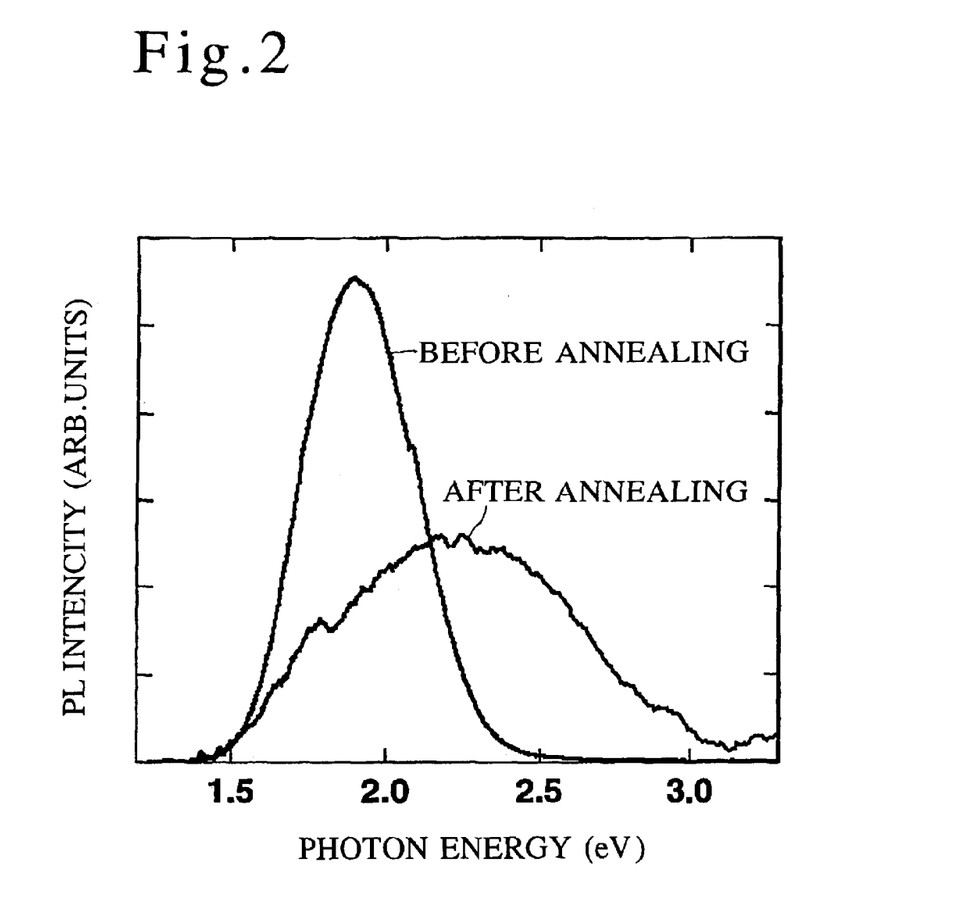
FIG. 2 shows the characteristics of the photoluminescence spectrum of the optoelectronic material of the first embodiment.

FIG. 2 shows the PL spectrum of the optoelectronic material of the present embodiment. A helium cadmium (HeCd) laser (wavelength: 325 nm; output: 15 mW) was used as the excitation light source, and measurement was conducted at room temperature. While the peak location of the porous Si before annealing was in the vicinity of 1.9 eV, after one minute of annealing the peak blue-shifted, to a peak in the vicinity of 2.3 eV. In addition, it was evident that the spectrum was spreading into the high-energy side. These results indicate that nitriding the surface of the porous Si made it possible to control the electroluminescent wavelength.

Figure 3:
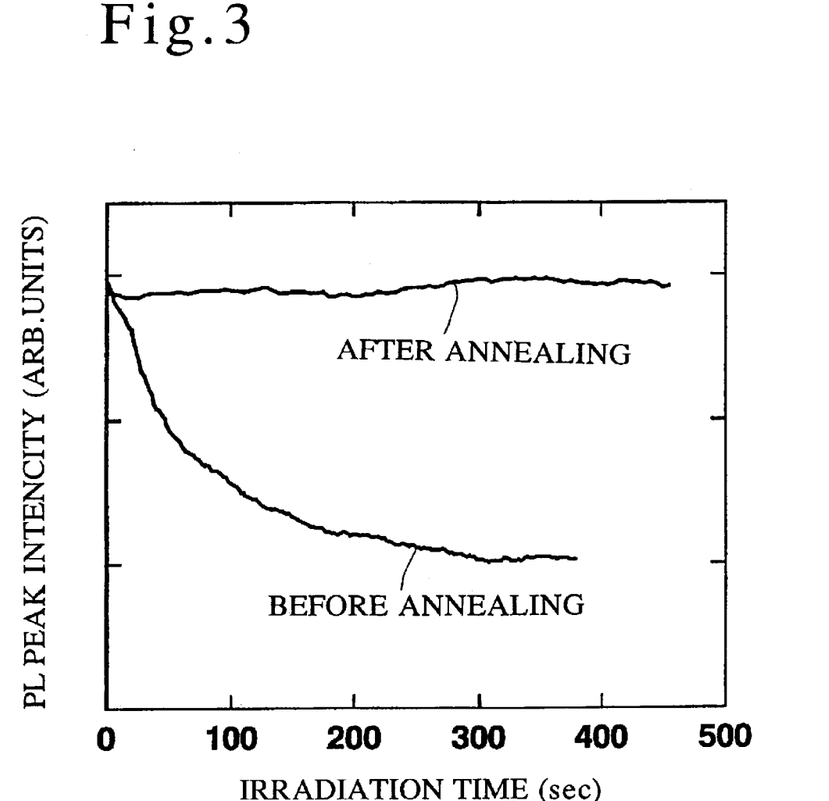
FIG. 3 shows the characteristics of the time dependency of the intensity of the photoluminescence of the optoelectronic material of the first embodiment.

FIG. 3 shows the dependence of the PL peak strength of the present embodiment on irradiation time. Before annealing, the intensity of the electroluminescence of the porous Si degraded with time of irradiation. This is because the surface of the porous Si is oxidized in the presence of air. In contrast, when annealed for one minute, the electroluminescence was stabilized, with almost no degradation of electroluminescence intensity after 1-hour irradiation.

Thus, the fact that visible-spectrum PL was obtained in the optoelectronic material of the present embodiment at room temperature indicates that the nitride layer coating, with a bandgap that is larger than Si, was able to express a quantum confinement effect in the electroluminescent Si. Additionally, because the impurity diffusion coefficient of the Si nitride layer was lower than that of the Si oxide layer, it is believed that the surface state was stabilized by nitriding the surface of the porous Si, enabling stable electroluminescence to be obtained, without the effects of oxide diffusion and the like, and without deterioration over time.

Figure 4:
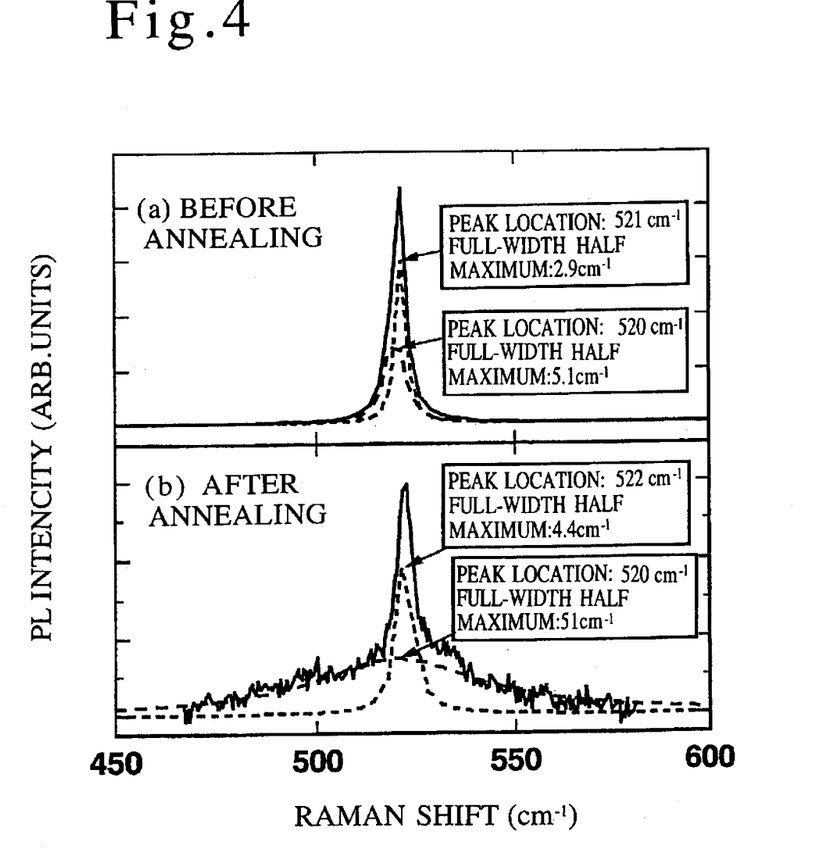
FIGS. 4(a) and 4(b) show the characteristics of the Raman scattering spectroscopy of the optoelectronic material of the first embodiment.

FIGS. 4 (a) and (b) show the Raman scattering spectrum of the optoelectronic material of the present embodiment before and after annealing. An Ar ion laser (wavelength: 514.5 nm; output: 27 mW) was used as the excitation light source, and measurement conducted at room temperature. In the figure, the solid line is the result of the measurement, and the dotted lines are the results of peak separation by 2 Gaussian distributions on each-spectrum. Of the two peaks, the peak shifting to the high wave frequency side was the same as bulk Si, with a peak location of 521 $cm^{-1}$ and full-width half maximum (FWHM) of 3–4 $cm^{-1}$. From this, it is thought that this spectrum is due to the submerged Si substrate. Comparing the peaks shifting to the low wave frequency side reveals that after one minute of annealing, the peak width had spread out widely. On the Raman scattering spectrum, the peak location shifted to the low wave frequency side due to quantum confinement, and the peak width in particular shifted to the low wave frequency side. Consequently, these results indicate that the quantum confinement effect was made more striking by nitriding the surface of the porous Si.

Thus, the present invention was able to obtain optoelectronic material with no oxidation of the surface of the porous Si, and no. degradation of the intensity of the electroluminescence. Furthermore, it was confirmed that annealing effectively caused a quantum confinement effect to manifest, also enabling the control of the electroluminescence wavelength.

Note that although the present embodiment used porous Si as the electroluminescent Si, silicon ultrafine particles with particle diameters on the nanometer order may be used.

Second Embodiment

Below is a detailed description of another optoelectronic material, and a manufacturing method therefor, of the present invention as a second embodiment thereof, using FIGS. 5(a), 5(b) and 6.

In the present embodiment are described an optoelectronic material comprising ultrafine particles, the surfaces or entirety of which are nitrided, and a manufacturing method therefor.

Figure 5A:
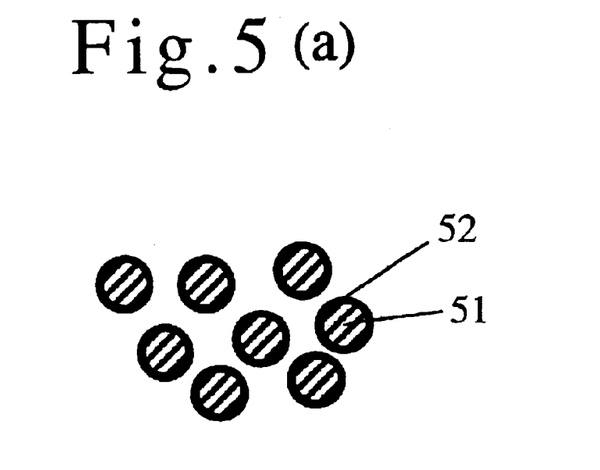
FIGS. 5(a) and 5(b) are cross-sectional views showing a construction of an optoelectronic material of a second embodiment of the present invention.
Figure 5B:
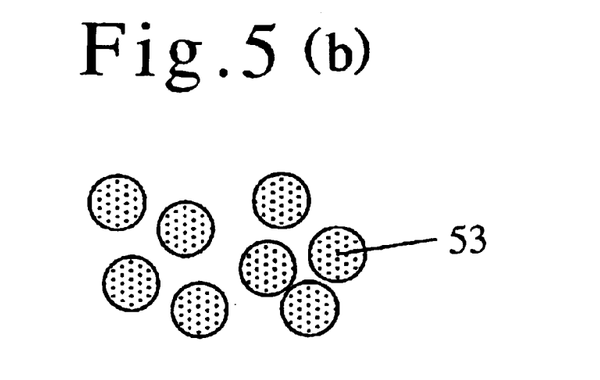

FIGS. 5(a) and 5(b) show cross-sectional views showing a construction of the optoelectronic material of the present embodiment. In FIG. 5(a), reference numeral 51 denotes Si ultrafine particles, and 52 a Si nitride layer formed on the surface thereof. FIG. 5(b) is nitrided Si ultrafine particles 53, the entirety of which is nitrided.

Next is described the method for manufacturing the optoelectronic material of the present embodiment. In the present embodiment, when the silicon ultrafine particles are deposited on the substrate, adhesion deposition is carried out on the substrate using laser ablation of the Si in an atmosphere of gas containing nitrogen (e.g. $N_2$, $NH_3$). Note that laser ablation means irradiation of the target material with laser light beam having high energy density (pulse energy of about 1.0 $J/cm^2$ or more), causing melting and desorption in the surface of the irradiated target material, and features a nonthermal equilibrium process. A specific effect of nonthermal equilibrium is that it enables spatial and temporal selection excitation. In particular, having spatial selection excitation characteristics allows only the material source to be excited, while with conventional heat or plasma processing a considerable area or the entirety of the reaction tank was exposed to heat or ions. This makes the process clean, controlling the contamination of impurities. Furthermore, the pulse laser excitation process has remarkable lower damage characteristics than the ion excitation process with the same nonthermal equilibrium characteristics. Material desorped during laser ablation is mainly ions and neutral particles that are atoms, molecules, and clusters (consisting of several to several tens of atoms) . The kinetic energy of this material reaches several tens to several hundreds of eV (electron volts) in the case of ions, and several eV in the case of neutral particles. This energy is significantly higher than that of heat-vaporized atoms, but significantly lower than the energy of an ordinary ion beam.

This clean, low-damage laser ablation process is suited to the fabrication of ultrafine particles with controlled impurity contamination, composition, crystal properties, and the like. This is because with the fabrication of ultrafine particles whose proportion of surface area is enormously large and influenced by structure, it is dispensable to provide low-damage characteristics, and when growing ultrafine particles by a thermal equilibrium process, it is impossible to prevent a wide distribution of such structural parameters as particle diameter.

Figure 6:
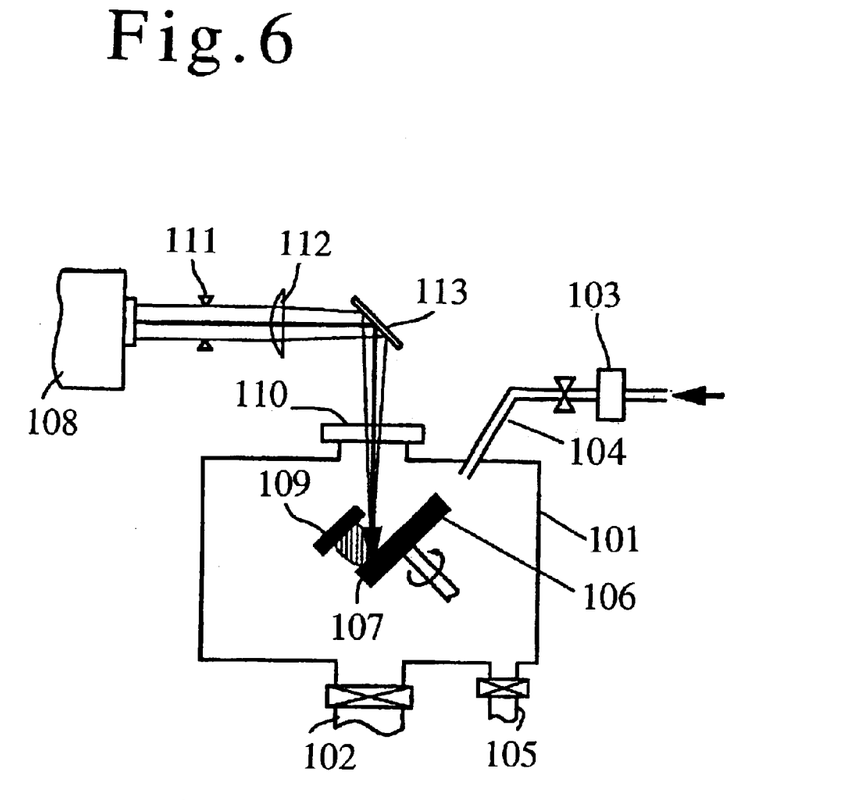
FIG. 6 is a conceptual diagram of a manufacturing apparatus of the optoelectronic material of the second embodiment.

Specifically, FIG. 6 is a conceptual construction diagram of the optoelectronic material manufacturing apparatus for forming ultrafine particles with sizes on the nanometer order, by laser ablation of the Si target. In FIG. 6, reference numeral 101 denotes a reaction chamber in which the target is placed; 102 an ultra-vacuum gas evacuation system that evacuates the air from inside the reaction chamber 101 to create an ultra vacuum; 103 a mass flow controller that controls the flow level of atmospheric gas supplied to reaction chamber 101; 104 a gas introduction line for supplying atmospheric gas to the reaction chamber 101; 105 a gas evacuation system that evacuates atmospheric gas from inside the reaction chamber 101; 106 a target holder that holds the target; 107 the target; 108 pulse laser light source that irradiates laser light as an energy beam; 109 a deposition substrate upon which material desorped and ejected from the target 107 that has been excited by laser beam irradiation is deposited; 110 a laser introduction window installed on the laser light introduction portion of the reaction chamber 101; 111 a slit to shape the laser light beam irradiated from the pulse laser light source; 112 a lens to condense laser light beam; and 113 a reflector to direct the irradiated laser light toward the target 107.

The operation of the optoelectronic material manufacturing apparatus having this construction is described below. In FIG. 6, first, after the ultra-high vacuum gas evacuation system 102 consisting chiefly of a turbo molecular pump creates an ultimate vacuum of about $1.0 \times 10^{-9}$ Torr in the all-metal reaction chamber 101, $N_2$ gas or helium (He) diluted $N_2$ gas (1%) is introduced therein by gas introduction line 104, via mass flow controller 103. Here, by linking operation with the gas evacuation system 105 having as its major component a dry rotary pump or high-pressure turbo molecular pump, the pressure of the inert gas inside the reaction chamber 101 is set to a single pressure value in the range of about 0.1–50 Torr in the case of $N_2$ gas.

Then in this state, the surface of the Si single-crystal target 107, with purity 4N, placed on the target holder 106 having a rotating mechanism, is irradiated with laser light beam from the pulse laser light source 108. Here, an argon fluorine (ArF) excimer laser (wavelength: 193 nm; pulse width: 12 ns: energy density: 1 J/cm$^2$; cycle frequency: 10 Hz) was used. At this point, a laser ablation phenomenon is generated on the surface of the Si target 107, and Si ions or neutral particles (atoms, molecules, clusters) are desorped, and at this time, material maintaining sizes of molecules or clusters is ejected mainly in the target normal direction, with a kinetic energy of 50 eV in the case of ions, and 5 eV in the case of neutral particles. Next, the ejected flying material scatters as it collides with the atmospheric gas atoms, and the kinetic energy is dissipated into the atmospheric gas, promoting association and agglomeration inside the chamber. Furthermore, at the same time chemical reactions occur with the atmospheric $N_2$ gas in the gas phase. As a result the material is deposited on the facing deposition substrate 109 located about 3 cm away, as nitrided Si ultrafine particles ranging in size from several to several tens of nanometers. The substrate and target temperatures are not actively controlled.

Note that here, $N_2$ gas is used as the atmospheric gas, but it is also permissible to use another nitrogen including gas, such as $NH_3$. In this case, in order to obtain ultrafine particles with the same particle size, it is sufficient to set the gas pressure so that the atmospheric gas has the same average gas density. For example, if $NH_3$ (gas density: 0.75 g/l) is used as the atmospheric gas, then using $N_2$ (gas density: 1.23 g/l) as a reference, it is sufficient to set the gas pressure approximately 1.6-fold. Alternatively, if He diluted $N_2$ gas (1%) (average gas density: 0.19 g/l) is used, it is sufficient to set the gas pressure about 6.5-fold.

The structure of the deposited ultrafine particles was assessed. This showed that in the case that the deposition was conducted with 100% $N_2$ or $NH_3$ gas as the atmospheric gas, as illustrated in FIG. 5 (b), nitrided Si ultrafine particles were formed that were nitrided nearly in their entirety. In contrast, in the case that the deposition was conducted in He diluted $N_2$ gas (1%) as the atmospheric gas, as illustrated in FIG. 5 (a), Si ultrafine particles nitrided only on the surface were formed.

These results indicate that with the fabrication of ultrafine particles by means of the method for manufacturing the optoelectronic material of the present embodiment, it was possible to deposit nitrided Si ultrafine particles by controlling the atmospheric gas pressure thereof. Additionally, the thickness of the nitride layer can be controlled by adjusting the composition and pressure of the atmospheric gas. In other words, the surface state can be controlled during the fabrication of ultrafine particles, by optimizing the interaction (collision, scattering, and confinement effects) between the atmospheric gas and the material (mainly atoms, ions, and clusters) ejected from the target by means of laser irradiation. Consequently, if the present method is used, since a low-purity chemical compound formed by powder sintering or alloy target is not used, it is possible to manufacture ultrafine particles using a high-purity target by fusion refining a single element.

Furthermore, immediately after deposition, ultrafine particles have such problems as crystal defects and the presence of unpaired electron bonds. In such cases, in order to improve the film qualities, including crystallinity and purity, it is effective to anneal the deposition ultrafine particles in nitrogen atmosphere at between around 600 and 900 degrees Celsius.

Third Embodiment

Below is a detailed description of another method for manufacturing the optoelectronic material of the present invention as a third embodiment thereof.

In the present embodiment is described a method for manufacturing an optoelectronic material comprising ultrafine particles nitrided in their entirety. As with the second embodiment, an excimer laser is used as the light source, and using the optoelectronic material manufacturing apparatus shown in FIG. 6, laser ablation is carried out on the $Si_3N_4$ target, forming $Si_3N_4$ ultrafine particles.

Specifically, in FIG. 6, first, after the ultra-high vacuum gas evacuation system 102 consisting mainly of a turbo molecular pump creates an ultimate vacuum of $1.0 \times 10^{-9}$ Torr in the all-metal reaction chamber 101, ultra-pure (6N) helium (He) is introduced therein by the gas introduction line 104, via the mass flow controller 103. Here, by linking operation with the gas evacuation system 105 having as its major component a dry rotary pump or high-pressure turbo molecular pump, the gas pressure inside the reaction chamber 101 is set to a single pressure value in the range of about 0.1–100 Torr.

Then in this state, the surface of the $Si_3N_4$ powder sintered target 107, with purity 4N, placed on the target holder 106 having a rotating mechanism, is irradiated with laser light beam from the pulse laser light source. 108. Here, an ArF excimer laser (wavelength: 193 nm; pulse width: 12 ns: energy density: 1 J/cm$^2$; cycle frequency: 10 Hz) was used. At this point, a laser ablation phenomenon is generated on the surface of the Si$_3$N$_4$ target 107, and ions or neutral particles (atoms, molecules, clusters) are desorped, and at this time, material maintaining sizes of molecules or clusters is ejected mainly in the target normal direction, with a kinetic energy of 50 eV in the case of ions, and 5 eV in the case of neutral particles. Next, the ejected flying material scatters as it collides with the atmospheric gas atoms, and the kinetic energy is dissipated into the atmospheric gas, promoting association and agglomeration inside the chamber. As a result, the material is deposited on the facing deposition substrate 109 located about 3 cm away, as Si$_3$N$_4$ ultrafine particles. The substrate and target temperatures are not actively controlled.

Note that here, He gas is used as the atmospheric gas, but another inert gas, such as Ar may be used. In this case, it is sufficient to set the gas pressure to the same average gas density. For example, if Ar (gas density: 1.78 g/l) is used as the atmospheric gas, then using He (gas density: 0.18 g/l) as a reference, it is sufficient to set the gas pressure approximately 0.1-fold.

The structure of the deposited ultrafine particles was assessed. As illustrated in FIG. 5 (*b*), Si$_3$N$_4$ ultrafine particles were formed that were nitrided nearly in their entirety.

These results indicate that with the fabrication of ultrafine particles by means of the method for manufacturing the optoelectronic material of the present embodiment, it was possible to deposit Si$_3$N$_4$ ultrafine particles with nearly the same composition as the target, by controlling the atmospheric gas pressure thereof, even when using an inert gas that does not contain nitrogen. In other words, by optimizing the interaction (collision, scattering, and confinement effects) between the inert gas and the material (mainly atoms, ions, and clusters) ejected from the target through laser irradiation, it is possible to form crystal compound ultrafine particles.

Here some observations on the effects of the atmospheric gas on laser ablation will be made. The material ejected from the target surface by means of laser irradiation maintains the composition of the target without being vaporized, and is propagated maintaining a straight line, mainly in the form of atoms and ions. In the presence of atmospheric gas, however, collisions cause scattering and rob energy from the material, changing the spatial dispersion at deposition, deposition speed, the distribution of kinetic energy of the deposition material, and the like. These changes differ depending on the type and kinetic energy of the ejected material. In general, it is believed that because heavier material (here, Si) is less susceptible to scattering, it maintains a straight path even during laser ablation. As a result, if deposition is carried out under low gas pressure, the material reaches the substrate in a state lacking nitrogen, which is susceptible to scattering and also has high vapor pressure.

At first, the atoms and ions ejected from the target travel at different speeds, but as the atmospheric gas pressure rises, they are more likely to collide with the atmospheric gas and scatter, causing their speed to slow, at the same time approaching a uniform speed. As a result, the ejected material is confined within a given space, controlling the lack of nitrogen that was occurring at low gas pressures. Because during laser ablation in an inert gas atmosphere, the only nitrogen supplied to the deposition material is that which has been ejected from the target, this effect is vital.

At the same time, when laser ablation is conducted in a high pressure gas atmosphere, the atmospheric gas is compressed, and its pressure and temperature raised, forming a shock front. Hence, some observations on the effects of this shock front on nitride formation will be made. Nitrided Si is formed in accordance with the following formula.

$$3Si+2N_2 \rightarrow Si_3N_4 \quad \text{(Formula 1)}$$

The increase in gas pressure promotes the formation of Si$_3$N$_4$ (the reaction progressing to the right in Formula 1), which is a reaction that brings about a reduction in mass and molar number. The increase in temperature thermally promotes the excitation of the ejected material. The increase in temperature, however, also works in the direction of increase of the generation energy of Si$_3$N$_4$, inhibiting the formation thereof. As the shock front proceeds forward and its distance from the target increases, the pressure and temperature decline.

Additionally, the generation energy decreases as the temperature falls. As a result of the above, a region meeting sufficiently low generation energy conditions and at the same time having a high temperature state is formed a certain distance from the target, and nitride reactions are promoted within this region. In other words, it is believed that the crystal cores of Si$_3$N$_4$ maintaining stoichiometry are formed in the region that promotes this gas-phase nitriding. Then with further airborne motion, the material rapidly cools as it agglomerates, reaching the substrate and providing Si$_3$N$_4$ ultrafine particles.

If the deposition substrate is placed so that it is in contact with this nitriding promotion region, the substrate surface becomes an active region, and migration of the crystal core generated by gas phase on the substrate is thought to cause orientation and crystallization. Conversely, if the deposition substrate is placed so that it is outside this nitriding promotion region, the microcrystals grown in gas phase reach the substrate while associating, which results in a non-oriented structure.

As is clear by the above observations, with laser ablation there is an interrelation between atmospheric gas pressure (P) and the distance between target and substrate (D). The material ejected from the target by means of laser irradiation goes into a plasma state called a plume. Because this plume is affected by collisions with the atmospheric gas, the size of the plume is dependent on the gas pressure: the higher the gas pressure, the smaller the plume. Furthermore, the features of the substrate deposition material depends greatly on the speed of the material ejected from the target when it reaches the deposition substrate. For this reason, in order to obtain the same characteristics, the value PD$_a$ must be in a constant relationship as a process condition for keeping the above-mentioned speed constant. Here, the value n is assumed to be between about 2 and 3. Consequently, for example in the case that D is doubled, the corresponding gas pressure may be set to about ¼–⅛.

Thus, in the optoelectronic material manufacturing method of the present embodiment, if laser ablation is conducted using a target material consisting of a material including an element with high vapor pressure (here, nitrogen), then in order to prevent stoichiometry from being altered when the element with high vapor pressure is removed, a method of supplementing the atmospheric gas with a high vapor-pressure element using a gas including a high vapor-pressure element is not used. Rather, a plume of the appropriate size is formed, by adjusting the atmospheric gas pressure and the distance between the target and deposition substrate, and forming ultrafine particles which maintain stoichiometry. In other words, inside a plume of the right size, the loss of elements with high vapor pressure is prevented, forming ultrafine particles on the deposition substrate with nearly the same composition as the target. Consequently, with the optoelectronic material manufacturing method of the present embodiment, the atmospheric gas pressure and distance between the target and deposition substrate are freely set to ensure that the plume with the appropriate size is formed.

When this method is used, it is possible to adjust the pressure of the atmospheric gas, or in other words to adjust the number of collisions between the material desorped from the target material and the atmospheric gas atoms, and control the proportion of element with high vapor pressure formed inside the plume and confined inside the high-temperature, high-pressure region, thereby controlling the characteristics of the substrate deposition material.

Furthermore, immediately after deposition, ultrafine particles have such problems as crystal defects and the presence of unpaired electron bonds. In such cases, in order to improve the film qualities, including crystallinity and purity, it is effective to anneal the deposition ultrafine particles in nitrogen atmosphere at between around 600 and 900 degrees Celsius.

Note that in the description above, a method for manufacturing $Si_3N_4$ ultrafine particles, which are two-element nitride ultrafine particles, were described. It is also possible, however, to use such substances as oxides as the target material for fabricating the ultrafine particles. Needless to say, it is also possible to use compounds consisting of three or more elements.

The present invention has been described, based on the preferred embodiments shown by the drawings. To a person skilled in the art, however, it would clearly be obvious to modify and/or change the present invention, and such modifications are included in the scope of the present invention.

What is claimed is:

1. A method for manufacturing an optoelectronic material comprising:

a target material placement step of placing a target material inside a reaction chamber;

a substrate placement step of placing a deposition substrate inside the reaction chamber; and an ablation step of irradiating the target material placed during said target material placement step with laser light beam, to generate desorption and ejection of said target material; thereby the material desorped and ejected during said ablation step on the target being condensed and grown in the ambient gas, and the ultrafine particles obtained thereby being deposited on said deposition substrate to obtain the optoelectronic material composed of said ultrafine particles, wherein an ambient gas is introduced into the reaction chamber at a constant pressure during said ablation step to nitride the surfaces of said ultrafine particles or the entirety thereof.

2. The method for manufacturing an optoelectronic material according to claim 1, further comprising a step of changing the pressure at which low-pressure gas is introduced to control the average particle diameter of said ultrafine particles.

3. The optoelectronic material manufactured by the method for manufacturing an optoelectronic material according to claim 2.

4. The optoelectronic material manufactured by the method for manufacturing an optoelectronic material according to claim 1.

5. A method for manufacturing an optoelectronic material comprising:

a target material placement step of placing a target material inside a reaction chamber;

a substrate placement step of placing a deposition substrate inside the reaction chamber; and an ablation step of irradiating the target material placed during said target material placement step with laser light beam to generate desorption and ejection of said target material; thereby, the material desorped and ejected during said ablation step on the target being condensed and grown in the ambient gas, and the ultrafine particles obtained thereby being deposited on said deposition substrate to obtain the optoelectronic material composed of said ultrafine particles, wherein the ultrafine particles to be obtained are composed of at least two elements, and using the target material with the same or nearly the same composition as said ultrafine particles, during said ablation step, inert gas is introduced into the reaction chamber at a constant pressure.

6. The method for manufacturing an optoelectronic material according to claim 5, wherein the ultrafine particles to be obtained are nitrided silicon ultrafine particles, and $Si_xN_y$ is used as the target.

7. The method for manufacturing an optoelectronic material according to claim 6, further comprising a step of changing the pressure at which low-pressure gas is introduced to control the average particle diameter of said ultrafine particles.

8. The optoelectronic material manufactured by the method for manufacturing an optoelectronic material according to claim 7.

9. The optoelectronic material manufactured by the method for manufacturing an optoelectronic material according to claim 6.

10. The method for manufacturing an optoelectronic material according to claim 5, further comprising a step of changing the pressure at which low-pressure gas is introduced to control the average particle diameter of said ultrafine particles.

11. The optoelectronic material manufactured by the method for manufacturing an optoelectronic material according to claim 10.

12. The optoelectronic material manufactured by the method for manufacturing an optoelectronic material according to claim 5.

* * * * *